Feb. 9, 1960

R. H. WILSON 2,924,809

TRANSISTOR CLIP

Filed May 13, 1957

INVENTOR:
Robert H. Wilson

By Herbert E. Metcalf
His Patent Attorney

United States Patent Office 2,924,809

Patented Feb. 9, 1960

2,924,809

TRANSISTOR CLIP

Robert H. Wilson, Anaheim, Calif., assignor to Northrop Corporation, Hawthorne, Calif., a corporation of California Application May 13, 1957, Serial No. 658,817

6 Claims. (Cl. 339—258)

This invention has to do with electronics and more particularly with a holder or clip for electronic components.

With the relatively recent development of transistors along with the miniaturization and subminiaturization of electronic components an increasingly apparent problem was created. There was no reliable method or device for holding the components in their respective environments. For instance, transistors were incorporated into printed circuits and these circuits, in the nature of "units" were subjected to and were required to pass certain rigid tests. The tests constituted, in some instances, severe vibrations or shocks. The absence of proper holding means resulted in the transistors being separated from the units. In short, they broke loose. Adding to the problem of adequately holding a transistor was the fact that the "can" of the semiconductor was tapered. The angle of taper was not large but it was an added complication to the solution of the problem.

An object of this invention is to provide a clip for miniature electrical and electronic components as well as other devices that will reliably hold the component in its proper location and environment regardless of the normal abuse that may be applied.

Another object of this invention is to provide a clip for transistors and other devices that has a plurality of resilient elements that provide a multiple contact and holding area that may engage the tapered component to be held.

A yet further object of this invention is to provide a clip, having a tab thereon, for transistors that extends into the printed circuit unit and prevents rotation of the clip when the unit is in use and subjected to certain vibrations.

A still further object of this invention is to provide a clip for transistors and other devices that has a tab that prevents the device from being shaken from the clip.

Briefly, the device comprises a U-shaped body having a bight or plate that is attached to a printed circuit unit or other device. The legs of the body are resilient and bifurcated to provide a firm four point contact on the component to be held. A pair of tabs are provided, one of which extends into an opening in the unit and prevents rotation of the clip and the other of which extends in the same direction as the legs and prevents inadvertent removal of the component from the clip.

Figure 1:
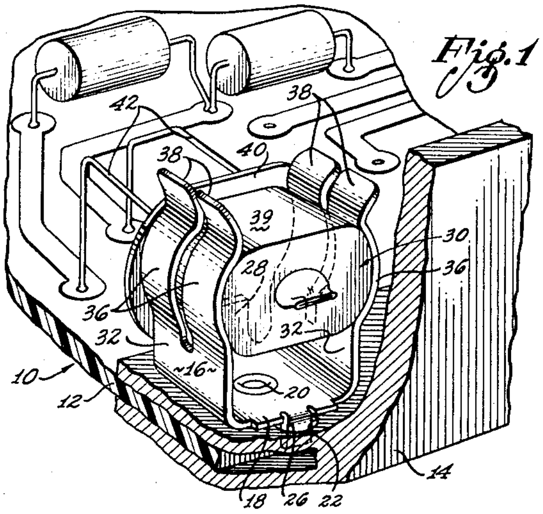
Figure 1 is a fragmentary perspective view illustrating and having embodied therein the present invention as it may be used in a printed circuit unit.
Figure 2:
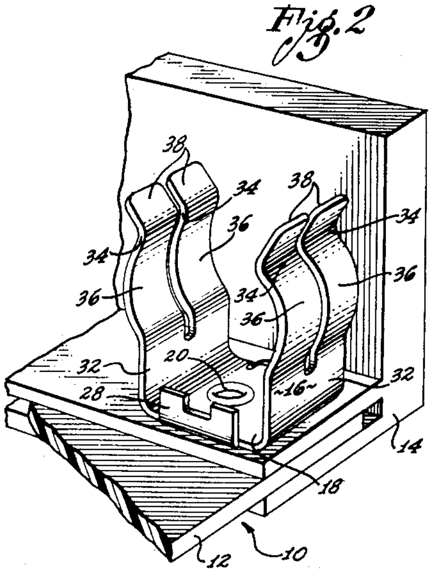
Figure 2 is a fragmentary perspective view of the clip, absent the transistor, and showing that end opposed to the view of Figure 1.

Referring to the drawings for a more detailed description of the present invention 10 designates a printed circuit unit which in the present instance comprises a board 12 and a rail 14. Most of the printed circuit components and related structure are located on the board.

The clip, broadly designated 16, is a U-shaped body having a bight or plate 18. The plate has an opening therethrough through which a rivet or fastener 20 extends for the purpose of attaching the clip to the unit 10, in the manner illustrated.

The board 12 and the rail 14 have an opening 22 therein into which extends a tab 26. The tab 26 in combination with the rivet 20 prevents the clip 16 from rotating.

Another stop tab 28 extending in a direction opposed to that of tab 26 contacts the component or article 30 when one is present or is in a position to prevent inadvertent removal of the component from the clip as a result of certain imposed vibrations or other conditions.

The sides 32 of the clip extend perpendicular to the bight 18 and are spaced from tab 28 and 26. The sides are bifurcated to provide four resilient legs 34. The legs, with reference to the bight, bend outwardly then inwardly to provide a concavo-convexo area 36 which receives the component 30. Then the legs bend outwardly on the free end 38 to provide an entrance area for the component.

Figures 3, 4, 5:
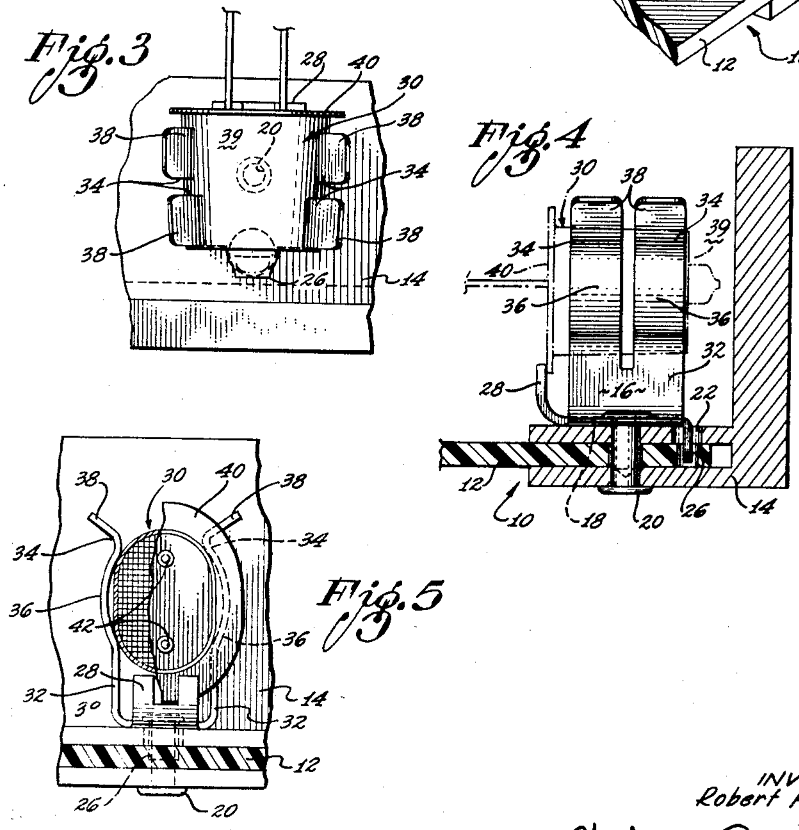
Figure 3 is a plan elevation view illustrating the clip and the position assumed by the resilient legs when a tapered component such as a transistor is held.
Figure 4 is a side elevation view of the clip illustrating the relationship of the tabs with respect to the transistor and printed circuit unit.
Figure 5 is an end elevation view showing a clip that is narrower than that illustrated in Figures 1 to 4, in order that a transistor may be placed in the clip in a slightly different manner; in all other respects the clip is identical to that shown in the other figures.

The operation and mounting of the clip 16 is as follows: The tab 26 is properly located in the openings 22 and the clip is fastened in place by the rivet or fastener 20. The component in the nature of a transistor having a tapered can or body 39 is pressed or snapped into place, as illustrated, with the annular flange 40 of the can between tab 26 and 28 and adjacent tab 28. The flange 40 extends beyond the legs 34 and is between the latter and the tab 28 in the manner illustrated in Figures 1, 3, 4 and 5. This is done to prevent the component from moving outwardly of the clip 16. As illustrated, the transistor cannot move out of the clip in the direction opposed to the tab 28 because the flange 40 is between the tab 28 and the legs 34. The component 30 may only be inserted or removed from the clip 16 by lifting up or pressing the same down between the legs 34. Due to the fact that the can is tapered two opposed legs 34 extend inwardly toward the center of the clip a greater distance than the other two. As a result there is a four point contact on the component which provides a greater holding area than if there were only two legs. The component 30, by virtue of this provision, is more firmly held and resists the forces of vibration to a greater degree.

It is to be noted that the component 30 does not touch or contact the bight 18. Such vibration and shock as is imposed on the component is taken or absorbed by the resilient legs 34. As a result, a severe impact is not imposed on the semiconductor. Each leg will move in the same direction as each other leg and in the same amount when vibrations are present. Therefore, the component is always firmly held and random vibrations that may originate or stem from the bight 18, or other structure, are not imposed in their full force on the legs 34 or the component 30. Further, the electrical leads 42 extending out of the transistor 30 are not subjected to severe forces that come from several conflicting directions. As a result these delicate wires are adequately protected against severing or breaking. Additionally, the space between the areas 36 and the bight 18 provides space through which air may circulate to cool the component 30.

While in order to comply with the statute, the invention has been described in language more or less specific as to structural features, it is to be understood that the invention is not limited to the specific features shown, but that the means and construction herein disclosed comprise a preferred form of putting the invention into effect, and the invention is therefore claimed in any of its forms or modifications within the legitimate and valid scope of the appended claims.

What is claimed is:

1. In a printed circuit unit having a rail attached to a board, a clip on said unit comprising a U-shaped body, the legs of which are bifurcated and resilient to provide a four point contact on a component to be held, the component having a circumferential flange; a tab on the bight of said body that extends in a direction opposed to said legs and into an opening in said unit that is adjacent said rail; and a second tab on said bight that extends in the same direction as said legs, said legs being adapted to overlie one side of the component flange and said second tab being spaced from said legs so as to overlie an end of the component on the other side of its flange.

2. In a printed circuit unit having a rail attached to a board, a clip on said unit comprising a plate having an opening therein through which a fastener extends to attach said clip to said unit; legs on and integral with said plate; said legs being bent outwardly, inwardly, and outwardly with reference to said plate; said legs being resilient and partially bifurcated to provide a four point contact on a tapered component to be held, the component having a circumferential flange; a tab on said plate that extends in a direction opposed to said legs and into an opening in said unit that is adjacent said rail; and a second tab on said plate that extends in the same direction as said legs, said legs being adapted to overlie one side of the component flange, and said second tab being spaced from said legs so as to overlie an end of the component on the other side of its flange.

3. In combination with an article of manufacture having a tapered body and an integral annular flange, an article holding clip comprising a plate; legs on and integral with said plate; said legs being bent outwardly, inwardly and outwardly with reference to said plate; said legs being resilient and partially bifurcated to provide a four point contact on the tapered body of said article to be held; a tab on said plate that extends in a direction opposed to said legs; and a second tab on said plate that is spaced from and extends in the same direction as said legs and in combination with said legs prevents movement of said article; said flange of said article being between said second tab and said legs.

4. A clip for holding an article having a circumferential flange comprising: a U-shaped body; a tab on the bight of said body that extends in a direction opposed to the legs of said body; and a second tab on the bight that extends in the same direction as the legs and is spaced therefrom so that the circumferential flange on the article to be held will fit between said second tab and said legs.

5. A clip for holding an article having a circumferential flange comprising: a U-shaped body; a tab on one end of the bight of said body extending in a direction opposed to the legs of said body; and a second tab on the other end of said bight extending in the same direction as said legs, said second tab being spaced from said legs so that the circumferential flange on an article to be gripped by said legs will fit between the latter and said second tab, said tabs being in a substantially parallel relationship; the bight of said body having a fastener receiving opening therein that is located between said tabs.

6. A clip for holding an article having a circumferential flange comprising: a U-shaped body, the legs of which are bifurcated to provide a four-point contact on the article; a tab on the bight of said body that extends in a direction opposed to said legs; and a second tab on said bight that extends in the same direction as said legs and is adapted to overhang an end of the article, said second tab being spaced from said legs so that the flange on the article will fit between said second tab and said legs.

References Cited in the file of this patent

UNITED STATES PATENTS

| | | |
|---|---|---|
| 825,332 | Mack | July 10, 1906 |
| 945,017 | Cole | Jan. 4, 1910 |
| 1,194,882 | Sachs | Aug. 15, 1916 |
| 2,068,314 | Dotterer | Jan. 19, 1937 |
| 2,114,523 | Cleveland | Apr. 19, 1938 |
| 2,462,622 | Farrow | Feb. 22, 1949 |
| 2,621,227 | McMahon | Dec. 9, 1952 |
| 2,738,486 | Wadsworth | Mar. 13, 1956 |
| 2,777,118 | Sundt | Jan. 8, 1957 |